United States Patent [19]
Wang

[11] Patent Number: 5,820,950
[45] Date of Patent: Oct. 13, 1998

[54] OPTICAL PELLICLE AND PACKAGE

[75] Inventor: Ching-Bore Wang, Fremont, Calif.

[73] Assignee: Micro Lithography, Inc., Sunnyvale, Calif.

[21] Appl. No.: 741,864

[22] Filed: Oct. 30, 1996

[51] Int. Cl.$^6$ .................................................. G03F 9/00
[52] U.S. Cl. ................................................. 428/14; 430/5
[58] Field of Search ................................ 428/14; 355/30; 430/5

[56] References Cited

U.S. PATENT DOCUMENTS

| | | | |
|---|---|---|---|
| 4,131,363 | 12/1978 | Shea et al. | 428/14 |
| 4,470,508 | 9/1984 | Yen | 206/334 |
| 4,511,038 | 4/1985 | Miller et al. | 206/454 |
| 4,697,701 | 10/1987 | Ying | 206/316 |
| 5,203,961 | 4/1993 | Yen | 156/645 |
| 5,254,375 | 10/1993 | Yen | 428/14 |
| 5,305,878 | 4/1994 | Yen | 206/316.1 |
| 5,422,704 | 6/1995 | Sego | 428/14 |

OTHER PUBLICATIONS

Micro Lithography, Inc. Pellicle Packaging Photograph Nos. 1–10, Apr. 8, 1996.
Micro Lithography, Inc. Pellicle Packaging Photograph Nos. 11–17, Oct. 11, 1994.

Primary Examiner—Alexander Thomas
Attorney, Agent, or Firm—Kolisch Hartwell Dickinson McCormack & Heauser

[57] ABSTRACT

An optical pellicle and package are disclosed. The optical pellicle includes a pellicle membrane and a pellicle frame with a cover side, a membrane side and an outer edge. The pellicle membrane is mounted and covers a substantial portion of the membrane side of the pellicle frame. The membrane side of the pellicle frame includes a peripheral region that extends beyond the pellicle membrane. In one embodiment of the invention, the peripheral region includes a relieved portion at the periphery of the membrane side of the pellicle frame. Another embodiment includes one of the previously described optical pellicles and a package. The package includes a first piece and a second piece. The first piece includes a structure for supporting an optical pellicle. The structure is configured to support the optical pellicle so that the pellicle membrane is free from contact with the first piece of the package. The second piece of the package is configured to mate with the first piece, thereby enclosing the optical pellicle within the package. When enclosed within the package, the pellicle membrane is free from contact with the first and second pieces of the package. Finally, a method for assembling such a packaged pellicle is also disclosed.

5 Claims, 6 Drawing Sheets

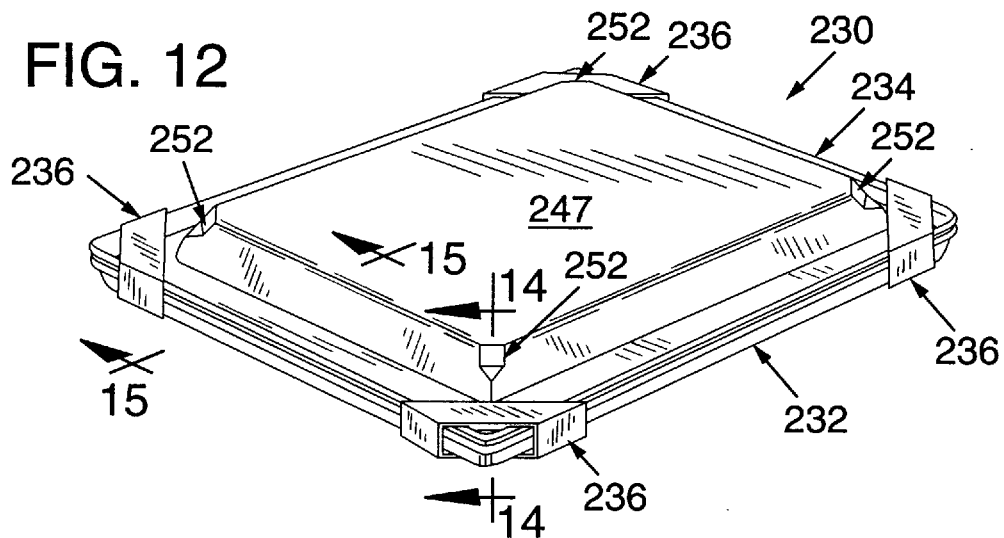
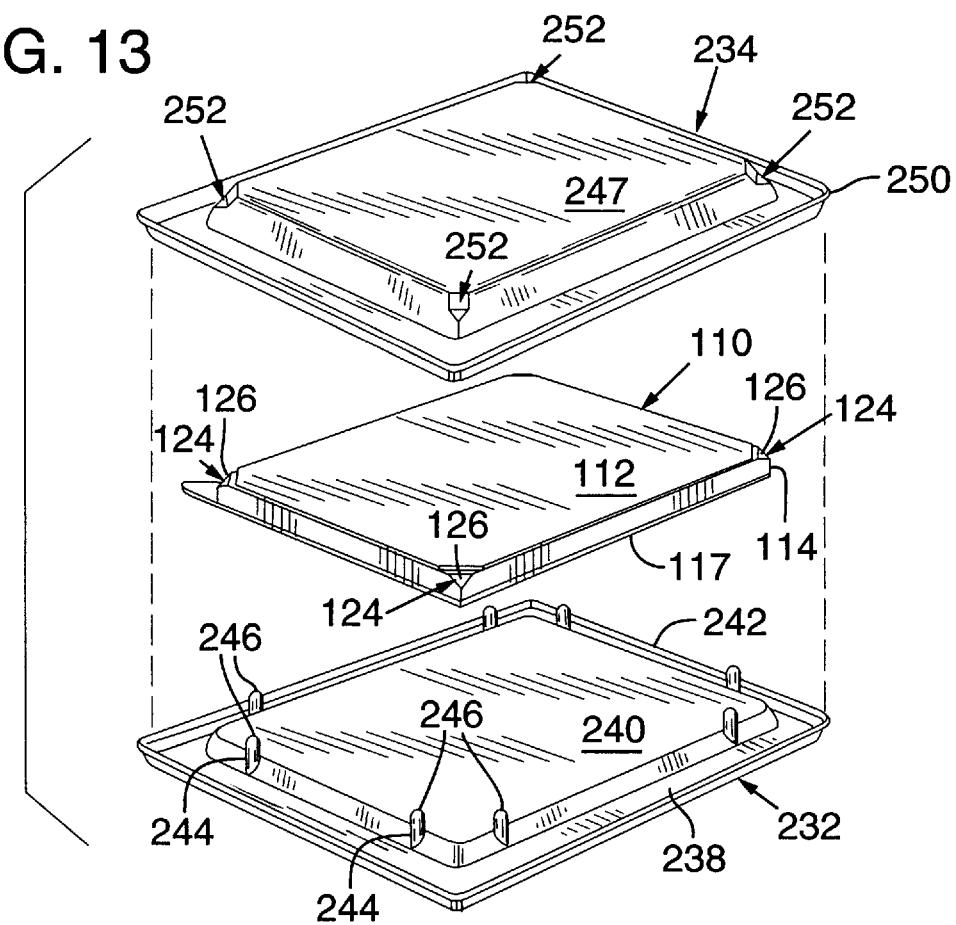

OPTICAL PELLICLE AND PACKAGE

BACKGROUND OF THE INVENTION

The present invention relates to optical pellicles, and more particularly to an optical pellicle packaging system.

In the semi-conductor chip industry it is well known that pattern transfer from a photomask to a substrate is accomplished by exposing the mask to a light source. During the pattern transfer process, also called the photolithographic process, patterns on the photomask are projected onto the substrate, which has been treated with a photosensitive substance. This results in the mask etchings being reproduced onto the substrate. Unfortunately, any foreign substance on the surface of the mask will also be reproduced on the substrate and therefore will interfere with proper pattern transfer to the substrate.

To eliminate contamination of the mask surface, a framed, thin membrane known as a pellicle is mounted on the mask surface, such that the pellicle membrane extends parallel to the mask at a predetermined distance spaced away from it. Any contamination that would ordinarily land on the mask surface instead falls onto the pellicle membrane.

Pellicles substantially eliminate the above problem because contamination on the pellicle membrane generally will not be projected onto the substrate. The frame of the pellicle supports the membrane at a distance spaced away from the mask surface so any particles or other contaminants on the pellicle membrane will be out of focus during pattern transfer.

The use of pellicles can increase the quality of the resulting circuit, thereby dramatically improving circuit fabrication productivity. Consequently, it is no surprise that pellicle manufacturing techniques have become increasingly important because high quality pellicles are critical to the success of the photolithographic process.

During the pellicle manufacturing process, it is important to minimize the possibility of either relatively large or small contaminant particles being deposited on the pellicle membrane. Relatively large particles are unacceptable because they may be reproduced in the substrate during photolithography, even though they are out of focus. Equally unacceptable are particles (whether large or small) that are deposited on the underside of the pellicle membrane or the pellicle frame. Such particles may drop onto the mask surface during photolithography, which is precisely what is to be avoided by using pellicles.

It is also critical that the pellicle membrane be extremely transparent and uniform across its surface. Because of this, pellicle membranes are normally extremely thin and are therefore quite fragile. Existing packaging systems often hold an optical pellicle in such a manner that the pellicle membrane itself is in contact with the pellicle package. This contact can damage the pellicle membrane in such a way that it is torn and is therefore not usable. It is also possible that the pellicle membrane can be damaged in the less visible fashion, but in such a way that particulate or other debris could rub off of the peripheral edges of the pellicle membrane that contact the package. This could result in rejection of the pellicle by the end user.

One conventional packaging system such as that described above is disclosed in U.S. Pat. No. 4,697,701 to Ming Haw Ying. It can be seen in FIG. 3 of this patent that the top of the package directly contacts the peripheral portions of the optical pellicle membrane. Another such system is disclosed in U.S. Pat. No. 4,511,038 to Anne K. M. Miller. FIGS. 3 and 8 of this second patent show that the bottom portion of the package is in direct contact with the peripheral portions of the pellicle membrane.

Thus, it is an object of the present invention to develop a pellicle packaging system that avoids the drawbacks and limitations of the prior art proposals. More specifically, the invention has as an object to develop a packaging system in which the pellicle membrane itself is not in contact with any portion of the packaging system, so to prevent any damage to the pellicle membrane during packaging, transport, and unpackaging of the pellicle. It is also an object of the present invention to develop a pellicle packaging system that is inexpensive to fabricate, is extremely clean, and which may be used by one having minimal amount of skill, education or training.

SUMMARY OF THE INVENTION

One aspect of the invention comprises an optical pellicle that includes a pellicle membrane and a pellicle frame with a bottom cover side, a top membrane side and an outer edge that extends downwardly from the membrane side to the cover side. The pellicle membrane is mounted to and covers a substantial portion of the membrane side of the pellicle frame. The membrane side of the pellicle frame includes a peripheral region that extends generally downwardly toward the cover side beyond the pellicle membrane.

In one embodiment of the invention, the peripheral region includes a relieved portion at the periphery of the membrane side of the pellicle frame. In a variation of the invention, the relieved portion includes a chamfer. In another variation, the relieved portion is arcuate. In still another variation of the invention, the relieved portion includes a first region extending toward the outer edge at a first defined angle and a second region extending from the first region to the outer edge at a second defined angle. Another embodiment includes one of the previously described optical pellicles in which the pellicle frame has a generally polygonal configuration with plural corner regions, and the peripheral region includes the corner regions of the pellicle frame.

Another aspect of the invention comprises an optical pellicle frame having a cover side designed to receive a cover, and a planar membrane side designed to have a membrane disposed thereon, the membrane side being disposed along a membrane plane. The term "membrane plane" as used herein refers to an imaginary plane which coincides with the surface of the membrane side. An outer edge extends between the cover side and the membrane side. The frame further includes a peripheral region extending from the membrane side substantially out of the membrane plane.

Yet another aspect of the present invention is a packaged optical pellicle that includes an optical pellicle and a package. The pellicle includes a membrane mounted to a frame. The frame includes a cover side, a membrane side and an outer edge extending between the cover side and the membrane side. The membrane side further includes a peripheral region that extends toward the outer edge. The pellicle membrane is mounted on and covers substantially all of the membrane side other than the peripheral region. The phrase "substantially all" as used herein is intended to encompass a pellicle where the membrane might be inset slightly from the peripheral edge for manufacturing tolerances and to account for a membrane trimming operation that might cause the membrane to terminate short of the peripheral edge.

Still another aspect of the present invention comprises a method for packaging an optical pellicle. The method includes the steps of: (1) providing a package and an optical pellicle, wherein the package includes a first piece having a structure for supporting an optical pellicle and a second piece that is configured to mate with the first piece, and wherein the optical pellicle includes a pellicle frame having a membrane side, a cover side, and an outer edge that extends between the cover side and the membrane side of the pellicle frame, a pellicle membrane mounted on and covering a substantial portion of the membrane side of the pellicle frame, and a protective cover mounted on and substantially coexetensive with the cover side of the pellicle frame; (2) positioning the optical pellicle proximate the structure for supporting an optical pellicle on the first piece of the package; (3) placing the optical pellicle onto the structure for supporting an optical pellicle so that the pellicle membrane is free from contact with the first piece of the package; and (4) enclosing the optical pellicle by engaging the first piece of the package with the second piece of the package so that the pellicle membrane is free from contact with the first and second pieces of the package.

Various other features, objects and advantages of the present invention will be become fully apparent as this description continues.

BRIEF DESCRIPTION OF THE DRAWINGS

FIG. 12 is a perspective view of yet another embodiment of a packaged optical pellicle constructed in accordance with the present invention. The package includes a first piece, a second piece, and four clips that slidably engage the first and second pieces.

FIG. 13 is an exploded perspective view of the packaged optical pellicle of FIG. 12 with the clips removed.

DETAILED DESCRIPTION OF THE PREFERRED EMBODIMENT

Figure 1:
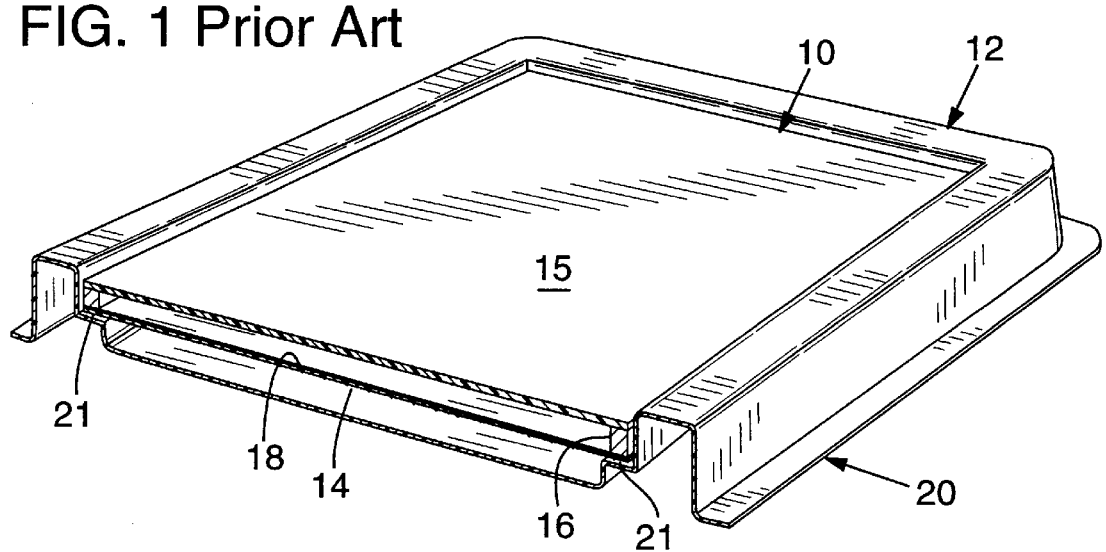
FIG. 1 is a sectional perspective view of a prior art optical pellicle and package, with the section taken along one end of the optical pellicle and package. The optical pellicle includes a pellicle membrane that is in direct contact with the package.

Turning now to the drawings, FIG. 1 depicts a conventional optical pellicle 10 and package 12. The pellicle 10, which is used as a dust cover in photolithography applications as described above, includes a pellicle membrane 14 and a pellicle frame 16. The membrane 14 and frame 16 are mounted together with a layer of adhesive 18. The pellicle 10 further includes a protective cover 15 mounted to the opposite side of the pellicle frame 16 as the pellicle membrane 14. Pellicle 10 is designed to be placed directly onto a photomask (not shown) to prevent dust and other particulate from falling onto the surface of the photomask. Instead, dust or other particulate will fall onto the pellicle membrane 14, thereby maintaining such particulate at a distance spaced from the surface of the photomask. Thus, such particulate will be out of focus in the photolithography operation and will therefore not normally be reproduced in the silicon wafer (not shown) positioned a predetermined distance below the photomask (not shown).

FIG. 1 also depicts a conventional package 12, which is used to protect the optical pellicle 10 during packaging, storage and transport. The package 12 includes a base 20 and a lid (not shown). The base 20 is designed to receive the optical pellicle 10, and the lid is configured to removably receive the base 20, thereby enclosing the optical pellicle 10 and presumably protecting the pellicle membrane 14 from damage or contamination. As indicated at 21 in FIG. 1, the pellicle membrane 14 is in direct contact with the base 20 of the package 12. While the base 20 only contacts the pellicle membrane 14 about its perimeter, in some circumstances this contact may be sufficient to generate particulate and thereby impair the viability of the pellicle 10.

The present invention deals with an optical pellicle and package that dramatically reduces the possibility of generating such particulate and thereby contaminating the pellicle.

Figure 2:
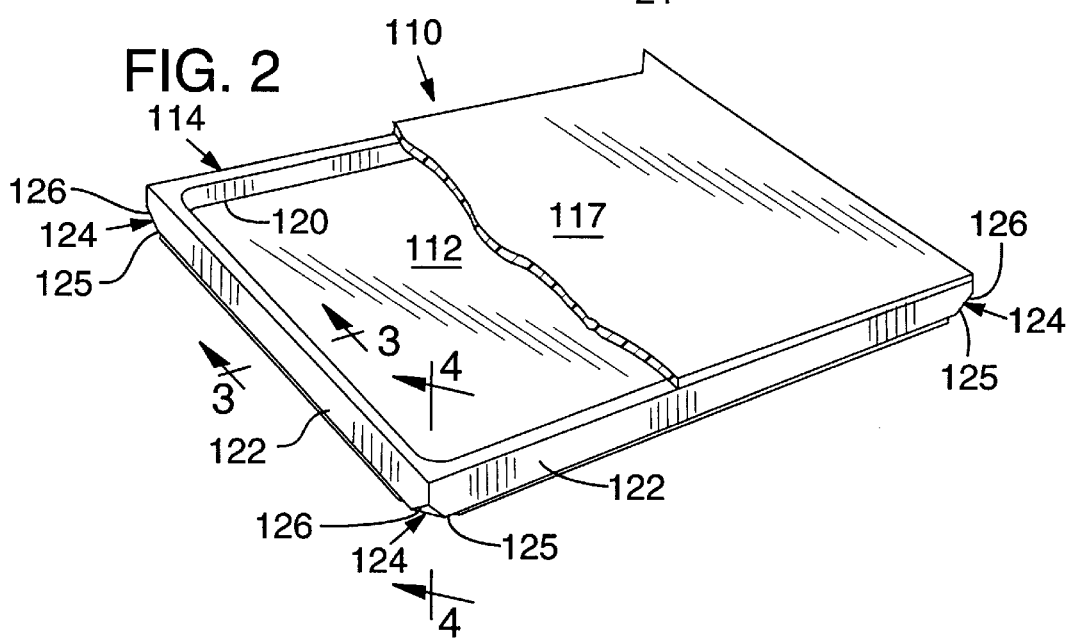
FIG. 2 is a perspective view of an optical pellicle constructed in accordance with the present invention, only with a portion of the protective cover broken away.
Figure 3:
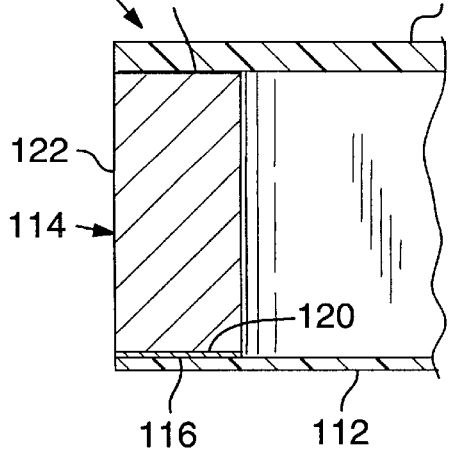
FIG. 3 is an enlarged, side-elevation sectional view of the pellicle of FIG. 2, taken along line 3—3 of FIG. 2.
Figure 4:
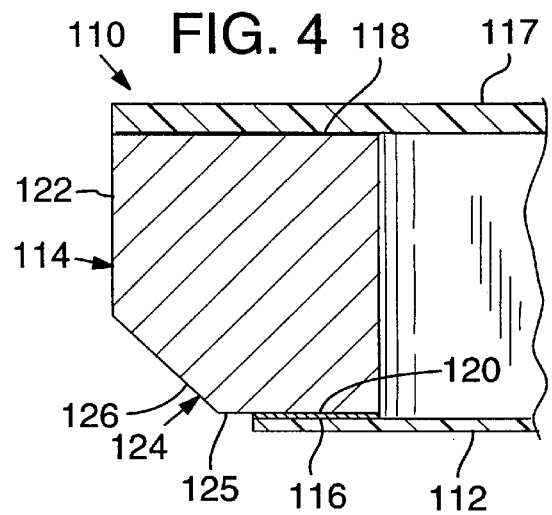
FIG. 4 is an enlarged, side-elevation sectional view of the pellicle of FIG. 2, taken along line 4—4 of FIG. 2.
Figure 5:
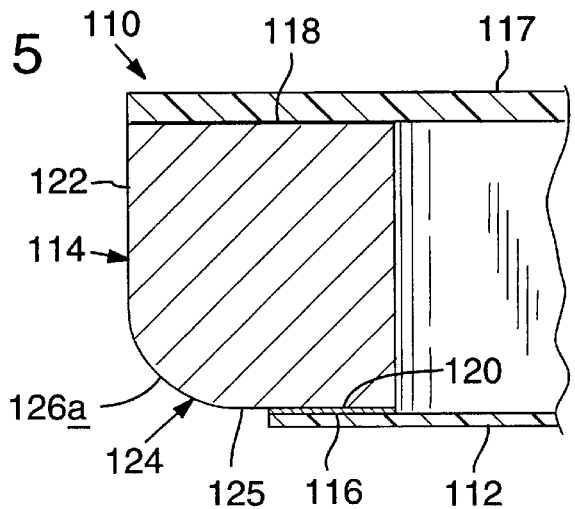
FIGS. 5 and 6 are enlarged, side-elevation sectional views of alternate embodiments of the optical pellicle shown in FIGS. 2 and 4.
Figure 6:
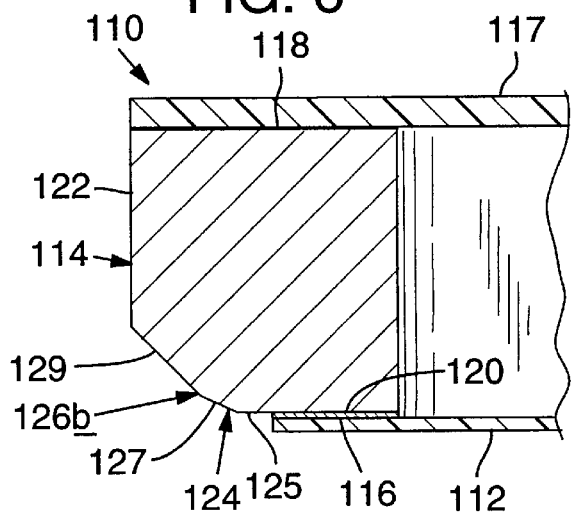

An optical pellicle constructed in accordance with the present invention is shown in FIGS. 2–4 and is generally indicated at 110. The pellicle 110 includes a pellicle membrane 112 and a pellicle frame 114. As shown in FIGS. 1–15, the thickness of the pellicle membrane 112 has been exaggerated for purposes of illustration. The pellicle frame 114 includes a cover side 118 and a membrane side 120. The pellicle membrane 112 is mounted to the membrane side 120 of the pellicle frame 114 and covers a substantial portion thereof. As shown in FIGS. 2–4, the pellicle membrane 112 is substantially coextensive with the membrane side 120 of the pellicle frame 114. An adhesive 116 is used to mount the pellicle membrane 112 to the pellicle frame 114. The pellicle frame 114 further includes an outer edge 122 that extends between the frame's cover side 118 and membrane side 120.

Pellicle membrane 112 is normally fabricated of nitrocellulose or some other cellulose-based polymer such as cellulose acetate. This material is typically first dissolved in a suitable solvent and is then spun onto a substrate while being supported at its edges by a perimeter frame of some sort. The perimeter frame is one that is used during the fabrication process and is different from the pellicle frame 114 shown in FIGS. 2–11 and on which the pellicle membrane 112 is sold and then used.

Adhesive 116 is selected and designed to be complementary and not degrading to the pellicle membrane 112. It is also selected to retain its spatial and positional integrity and its adhesive properties over extended time, agitation and exposure to electromagnetic radiation such as that utilized in pellicle film inspection and to light such as that utilized in photolithography. Adhesive 116 is also selected to maintain complete positional integrity such that it does not fragment or migrate subsequent to application. Preferably, adhesive 116 is selected to be a UV-cured adhesive such as Norland Optical Adhesive No. 65, marketed by Norland Products, Inc. Alternatively, Norland 81 or 61 adhesive, or other similar adhesives or conventional epoxies, may be utilized.

Pellicle frame 114 is depicted as being rectangular in configuration, but it should be understood that pellicle frames are of a wide variety of configurations, depending upon the photolithography equipment with which they are used. Examples of other such configurations include a polygonal configuration, a round or elliptic configuration and an oblong configuration with rounded ends. Pellicle frames are typically fabricated of anodized aluminum, although they could be constructed of a variety of other materials.

The optical pellicle shown in FIG. 2 further includes a protective cover 117, which is removably mounted on the cover side 118 of the pellicle frame 114. The protective cover 117 is normally fabricated of either 5 or 7.5 mil polyester, and is typically mounted to the pellicle frame 114 by acrylic adhesive (not shown), such as 3M 966 marketed by Minnesota Mining and Manufacturing Co. As shown, the protective cover 117 includes a tab 119 that extends beyond the pellicle frame 114. The tab 119 is used to provide a surface that can be readily grasped by a user to remove the protective cover 117 from the pellicle frame 114 prior to mounting the optical pellicle 110 to a photomask. It should be understood that the present invention can be practiced with an optical pellicle that does not include a protective cover, although such a cover is often preferred to further reduce the possibility of the pellicle membrane being contaminated by dust or other particulate.

Extending beyond the pellicle membrane 112, the membrane side 120 of the pellicle frame 114 includes a peripheral region 124, as shown in FIG. 2. The peripheral region 124 of the membrane side 120 could alternatively be thought of as extending between the pellicle membrane 112 and the outer edge 122. The pellicle frame 114 shown in FIG. 2 has a generally polygonal configuration, specifically a generally rectangular configuration, with plural corner regions 125. The peripheral region 124 includes these corner regions 125 on the pellicle frame 114. It should be understood that a round, or another configuration of the pellicle frame 114 that does not include corner regions 125, could still include a peripheral region 124 extending beyond the pellicle membrane 112, or extending between the pellicle membrane 112 and the outer edge 122, on the membrane side 120 of the pellicle frame 114. Such a configuration is intended to be within the scope of the invention. It should be further understood that the peripheral region 124 does not include the pellicle membrane 112, nor any portion thereof. In addition, the peripheral region 124 need not extend continuously around the entire membrane side 120 of the pellicle frame 114. As shown, the peripheral region 124 extends only at the four corner regions 125 of the pellicle frame 114. As seen best in FIG. 4, the pellicle membrane 112 often stops somewhat short of the peripheral region to prevent any possible overlap into the peripheral region 124 and to account for manufacturing tolerances. In this depicted embodiment the pellicle membrane can still be considered to cover substantially all of the membrane side other than the peripheral region. This is also true in the embodiments depicted in FIGS. 5, 6, 9 and 14.

The peripheral region 124 further includes a relieved portion 126 at the periphery of the membrane side 120 of the pellicle frame 114. In FIGS. 2 and 4, the relieved portion 126 includes a chamfer. Other embodiments of the relieved portion 126 include a relieved portion that is arcuate, as shown at 126a in FIG. 5, and a relieved portion, as shown at 126b in FIG. 6, which includes a first region 127 extending toward the outer edge 122 at a first defined angle and a second region 129 extending from the first region 127 to the outer edge 122 at a second defined angle. The first 127 and second 129 regions extend at angles between approximately 15° and 75°. Preferably they extend at angles between approximately 30° and 60°. The first and second defined angles may be either the same or different than each other. What is important, however, is that the first region 127 is of sufficient length and extends at a sufficient angle that the second region 129 may be engaged by the shoulder region 140 of the package 130 without the pellicle membrane 112 directly contacting the package 130.

It should be understood that the term "relieved portion," is meant to include all bevels, chamfers, or other straight and/or arcuate regions or surfaces extending at an angle between the membrane side 120 of the pellicle frame 114 and the outer edge 122 of the pellicle frame 114. The relieved portion 126 may be an integral part of the pellicle frame 114 as it is originally extruded or otherwise formed. Alternatively, the relieved portion 126 may be created by cutting, shaving or otherwise removing a portion of the corner regions 125 of a conventional pellicle frame. Other methods of producing the relieved portion 126 are certainly possible.

Figure 7:
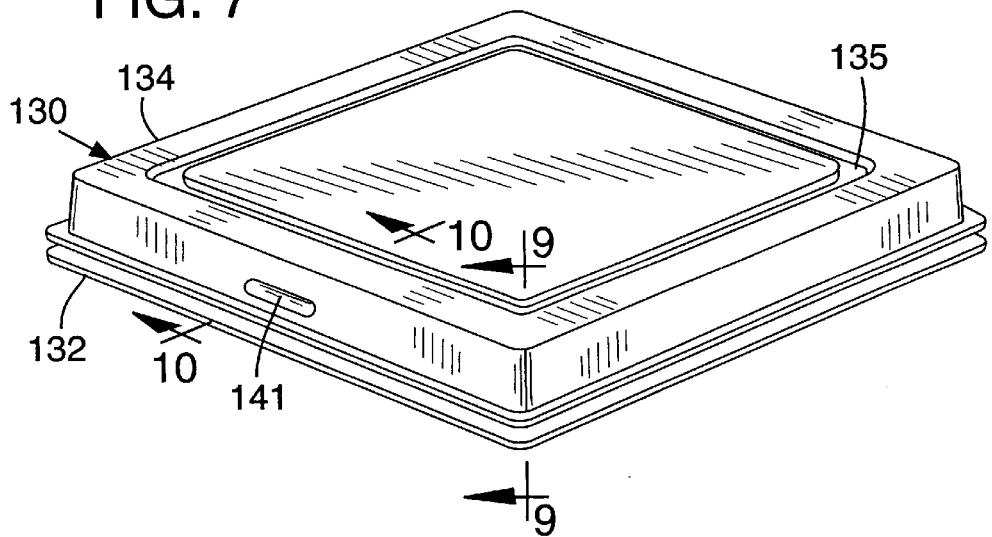
FIG. 7 is a perspective view of a packaged optical pellicle constructed in accordance with the present invention.
Figure 8:
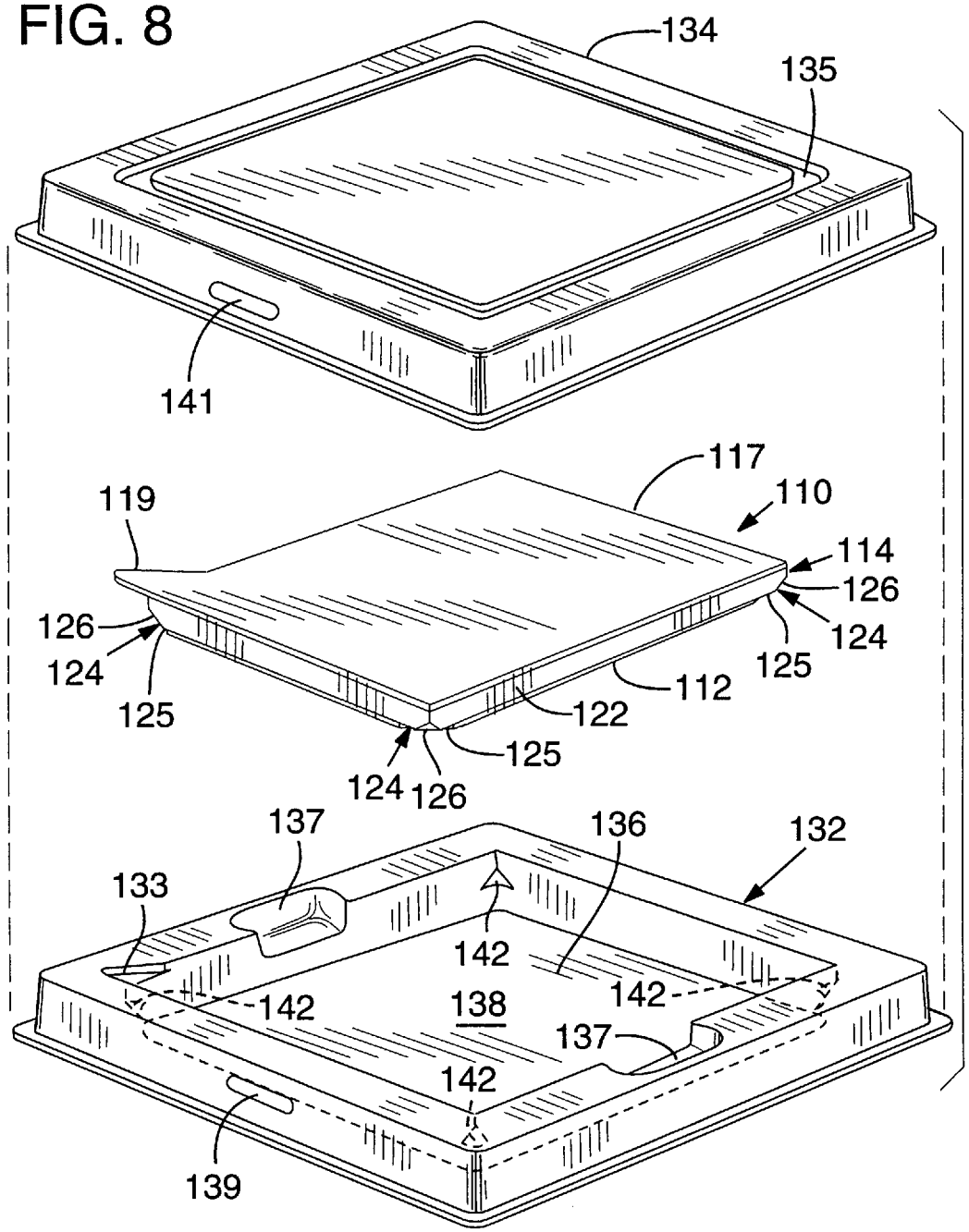
FIG. 8 is an exploded perspective view of the packaged optical pellicle of FIG. 7.

FIGS. 7–10 depict a packaged optical pellicle constructed in accordance with the present invention. The packaged optical pellicle includes one of the previously described optical pellicles 110 and a package 130. The package 130 includes a first piece 132 and a second piece 134. The first piece 132 includes a structure for supporting an optical pellicle. The structure is configured to support the optical pellicle 110 so that the pellicle membrane 112 is free from contact with the first piece 132 of the package 130. The second piece 134 of the package 130 is configured to mate with the first piece 132, thereby enclosing the optical pellicle 110 within the package 130, as shown in FIGS. 7–8. When enclosed within the package 130, the pellicle membrane 112 is free from contact with the first 132 and second 134 pieces of the package 130.

Figure 9:
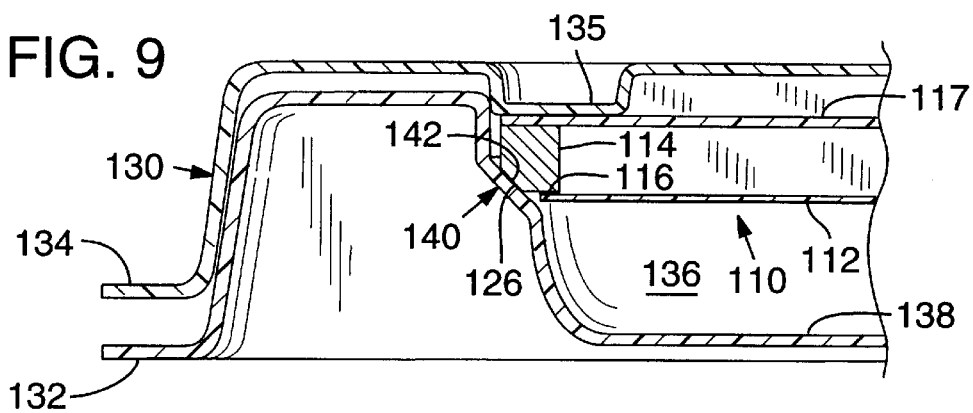
FIG. 9 is an enlarged, side-elevation sectional view of the packaged optical pellicle of FIG. 7 taken along line 9—9 of FIG. 7.
Figure 10:
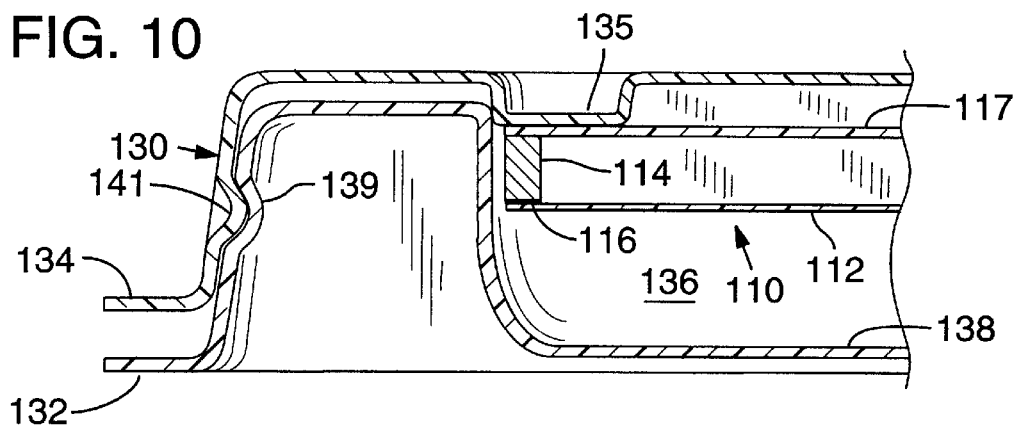
FIG. 10 is an enlarged, side-elevation sectional view of the packaged optical pellicle of FIG. 7 taken along line 10—10 of FIG. 7.

As shown in FIGS. 8–10, the first piece 132 defines a recess 136 that has a bottom portion 138. The recess 136 is configured to receive the optical pellicle 110. Further defined within the first piece 132 are a pair of finger depressions 137 and a depressed portion 133. The pair of finger depressions 137 permit a user to pull the optical pellicle 110 out of the recess 136 in the first portion 132 by using the user's thumb and index or middle finger. The depressed portion 133 is configured to receive the tab 119 on the optical pellicle's protective cover 117. The structure for supporting an optical pellicle includes a shoulder region 140 that extends inwardly into the recess 136 to engage at least a portion of the peripheral region 124 of the pellicle frame 114 to support the optical pellicle 110 with the recess 136, as shown in FIG. 9.

The second piece 134 is configured to receive the first piece 132 of the package 130, thereby enclosing the optical pellicle 110 within the package 130. Alternatively, the first piece 132 could receive the second piece 134 of the package 130. Either configuration, or others, are within the scope of the invention so long as the first 132 and second 134 pieces in some way mate to enclose and protect the optical pellicle 110 without directly contacting the pellicle membrane 112. As shown, the first piece 132 also includes a first pair of detents 139 for engagement with the second piece 134. The second piece 134 includes a second pair of detents 141 that are configured to nest with the first pair of detents 139 when the first 132 and second 134 pieces are brought into engagement with each other. The first 137 and second 139 pairs of detents are shown in the form of slat-like depressions, although other configurations are certainly possible. It is desirable that supplemental engagement means also be provided, normally in the form of adhesive tape (not shown) positioned on the first 132 and second 134 pieces of the package 130.

The second piece 134 further includes a depressed engagement surface 135. The engagement surface 135 generally corresponds with the configuration of the pellicle frame. When an optical pellicle 110 is contained within the package 130, the engagement surface 135 biases the optical pellicle 110 against the shoulder region 140 of the first piece 132 of the package 130. The second piece 134 typically also contains an adhesive coating (not shown) along at least a portion of its inner surface for dust-retention purposes.

As shown in FIGS. 8 and 9, the shoulder region 140 includes plural surfaces 142 that extend into the recess 136 to engage and support the optical pellicle 110. It should be understood that the invention may be practiced using many other configurations of shoulder regions 140 that are configured to engage at least a portion of the peripheral region 124 of the membrane side 120 of the pellicle frame 114. Preferably the shoulder region 140 engages at least a portion of the relieved portion 126 of the peripheral region 124. Even more preferably, the shoulder region 140 only engages the relieved portion 126 of the peripheral region 124.

As shown in FIGS. 8 and 10, the shoulder region 140 extends into the recess 136 at an angle that corresponds with the angle of the relieved portion 126. In this configuration, the shoulder region 140 is generally parallel to the relieved portion 126 of the peripheral region 124. This preferred configuration creates a surface of contact between the shoulder region 140 and the relieved portion 126. This is advantageous because this smooth contact region results in even less likelihood of particulate being created by contact between the package 130 and the optical pellicle 110. It should be understood, however, that other configurations of engagements between the relieved portion 126 and the shoulder region 140 are within the scope of the invention. For some applications, it may be desirable to have different configurations of engagements, such as line or even point contact between the relieved portion 126 and the shoulder region 140. It should be further understood that the invention can be practiced using a conventional package and one of the previously described optical pellicles 110.

Figure 11:
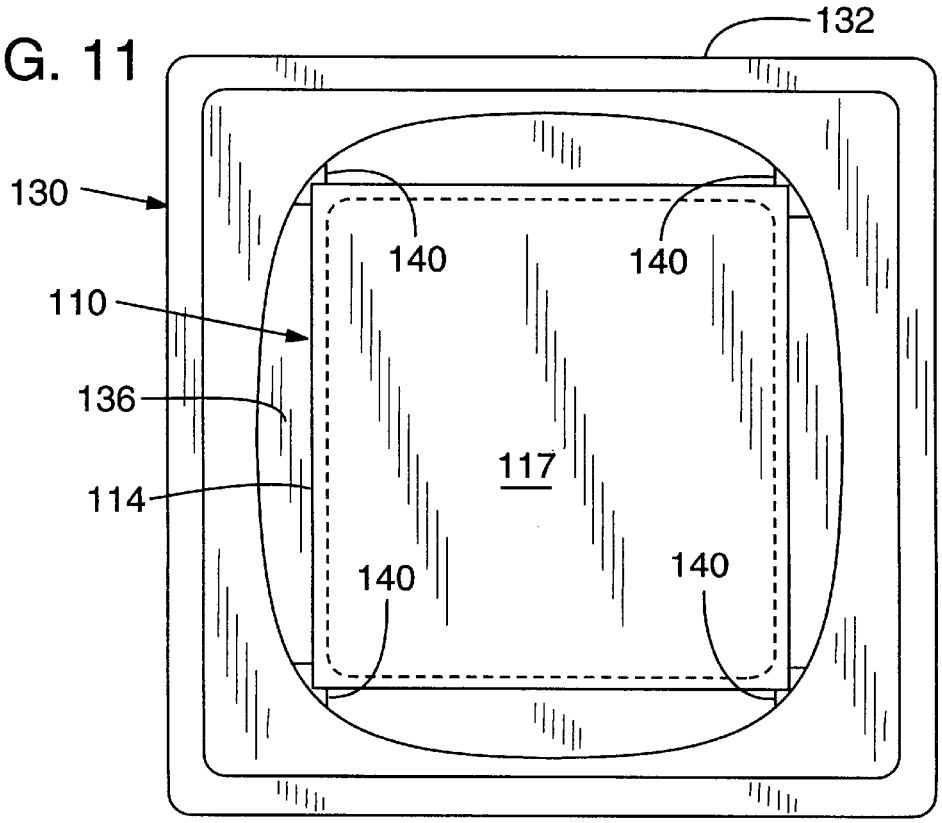
FIG. 11 is a top plan view of an alternate embodiment of the packaged optical pellicle of FIG. 7 with the second piece of the package removed.

When a pellicle frame 114, which has a peripheral region 124 that includes corner regions 125, is used, it is preferred that the shoulder region 140 only engage the corner regions 125 on the pellicle frame 114. One configuration of accomplishing such a result is to use a package 130 in which the recess 136 has a generally rounded configuration, as shown in FIG. 11. In this configuration, the shoulder region 140 is only able to contact directly the peripheral region 124, and preferably only the corner regions 125, of the membrane side 120 of the pellicle frame 114, while also not being able to contact the pellicle membrane 112. When the corner regions 125 include relieved portions 126, it is preferred that the shoulder region 140 only engages the relieved portions 126 of the corner regions 125. This configuration is also advantageous because it removes the possibility of particulate being generated by incidental contact between the first piece 132 of the package 130 and the outer edge 122 and/or pellicle membrane 112 if the optical pellicle 110 shifts within the package 130 during transport or other movement.

Preferably, shoulder region 140 supports the pellicle frame 114 within the recess 136 so that the pellicle membrane 112 is in a spaced relationship with the bottom portion 138 of the recess in the first piece 132 of the package 130. By "spaced relationship," it is meant that the pellicle membrane 112 faces the bottom portion 138 of the recess 136, but is not in direct contact with the bottom portion 138 or any other part of the first piece 132.

FIGS. 12–15 depict another, and currently most preferred, embodiment of a packaged optical pellicle constructed in accordance with the present invention. The packaged optical pellicle includes one of the previously described optical pellicles 110 and a package 230. The package 230 includes a first piece 232 and a second piece 234. The first piece 232 includes a structure for supporting an optical pellicle that is configured to support the optical pellicle 110 so that the pellicle membrane 112 is free from contact with the first piece 232 of the package 230. The second piece 234 of the package 230 is configured to mate with the first piece 232, thereby enclosing the optical pellicle 110 within the package 230, as shown in FIGS. 12–13. When enclosed within the package 230, the pellicle membrane 212 is free from contact with the first 232 and second 234 pieces of the package 230. The package 230 further includes plural removable clips 236 that slidably engage the first 232 and second 234 pieces of the package 230. The clips 236 prevent the first 232 and second 234 pieces from separating and thereby exposing the optical pellicle 110 to possible damage and contamination.

Figure 14:
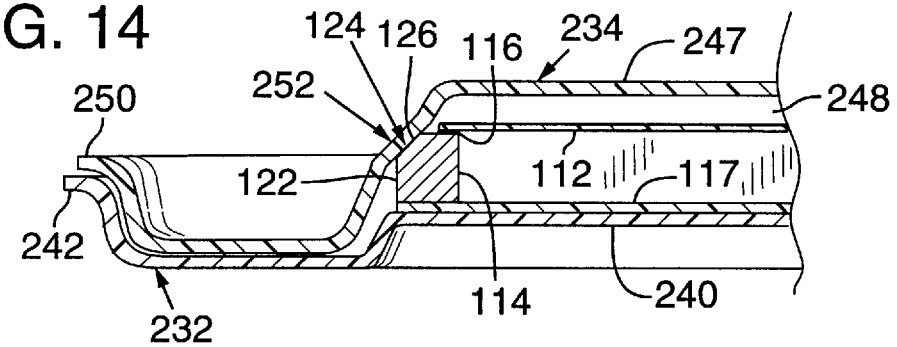
FIG. 14 is an enlarged, side-elevation sectional view of the packaged optical pellicle of FIG. 12 with the clips removed, taken along line 14—14 of FIG. 12.
Figure 15:
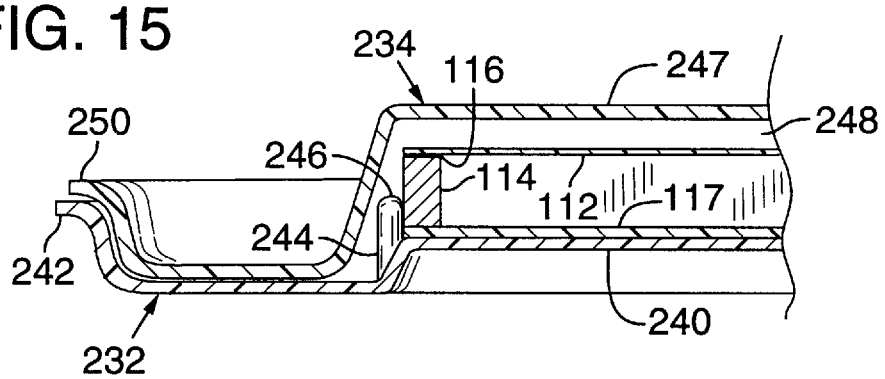
FIG. 15 is an enlarged, side-elevation sectional view of the packaged optical pellicle of FIG. 12 with the clips removed, taken along line 15—15 of FIG. 12.

As shown in FIGS. 13–15, the first piece 232 includes a base 238 and a raised lip 242 that extends upwardly from the base's perimeter. The structure for supporting an optical pellicle includes a centrally-disposed platform 240. Preferably, the platform 240 substantially corresponds to the shape of the pellicle frame 114 on the optical pellicle 110 to be supported. The pellicle frame 114 and the platform 240 shown in FIGS. 12–15 have generally rectangular configurations. It should be understood, however, that the platform 240 may have many other configurations to correspond with the shapes of other optical pellicles.

As shown, in FIGS. 13–15, the structure for supporting an optical pellicle further includes plural projections 244 that are spaced around the perimeter of the platform for frictionally retaining the optical pellicle on 110 on the platform 240. The projections 244 have a generally conical configuration with hemispherical tips 246 and also serve as positioning guides for placing the optical pellicle 110 on the platform 240. Other configurations of tips 246 are possible. The generally rounded configuration of the tips 246 is preferred, however, because it does not include corners or edges that could scratch or damage the optical pellicle 110. As shown in FIG. 13, the first piece 232 includes eight projections 244, two on each side of the platform 240. It should be understood that the invention may be practiced using projections 244 with different shapes, as well as using other spacings, quantities or heights of projections 244. It should be further understood that the invention could be practiced using a first piece in which the structure for supporting an optical pellicle includes the projections 244, yet does not include a platform 240. In this variation, the projections 244 extend from the base 238 of the first piece 232 and collectively outline the shape of the optical pellicle 110.

In the embodiment of the packaged optical pellicle shown in FIGS. 12–15, it should be understood that the optical pellicle 110 is positioned on the platform 240 so that protective cover 117 contacts the platform 240. In this orientation, the pellicle membrane 112 and peripheral region 124 face away from the platform 240. While FIG. 14 depicts the projections 244 being in actual contact with the outer edge 122 of the pellicle frame 113, it should be understood that the invention could also be practiced using a pellicle cover 117 that extends beyond the outer edge 122 of the pellicle frame 114. In this variation, the projections 244 would engage the edge of the protective cover 117 instead of the pellicle frame 114.

As shown in FIGS. 12–15, the second piece 234 has a raised upper surface 247 and has a lip 250 that extends around the perimeter of the second piece 234 and corresponds to the shape of the lip 242 on the first piece 232 of the package 230. The second piece 234 also defines a recess 248 and includes a shoulder region 252 that extends inwardly into the recess 248 to engage at least a portion of the peripheral region 124 of the optical pellicle 110 that is supported on the first piece 232. The shoulder region 252 extends into the recess 248 adjacent each corner region 125 of the optical pellicle 110 and does not contact the pellicle membrane 112. Preferably, the shoulder region 252 corresponds to the shape of the relieved portions 126 of the peripheral regions. As shown, the relieved portion 126 includes a chamfer, and the shoulder region 252 is configured to provide a surface of contact with the relieved portion 126 by engaging at least a portion of the relieved portion 126. It should be understood, however, that the shoulder region 252 could be configured to correspond to the shapes of any of the previously described relieved peripheral regions 124 and relieved portions 126. The second piece 134 typically also contains an adhesive coating (not shown) along at least a portion of its inner surface for dust-retention purposes.

Figure 16:
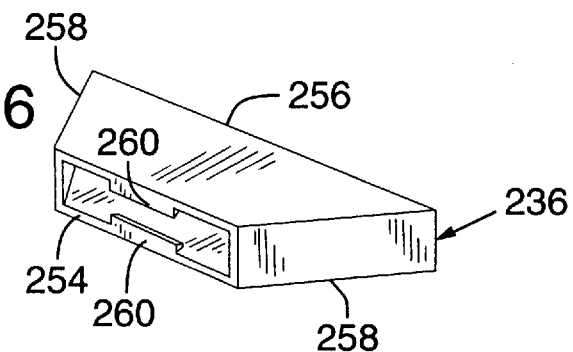
FIG. 16 is a front perspective view of one of the clips shown in FIG. 12.
Figure 17:
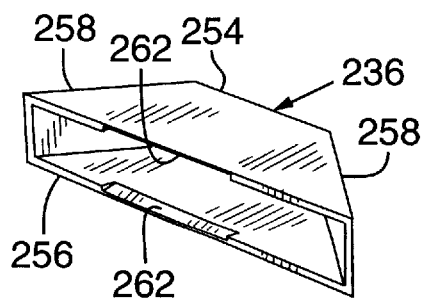
FIG. 17 is a rear perspective view of one of the clips shown in FIG. 12.

Once the optical pellicle 110 is enclosed within the package 230, the clips 236 can be inserted over the corners of the package 230 to prevent the package 230 from inadvertently opening. The clips 236 have a generally trapezoidal configuration and include front 254 and back 256 portions, which are connected by a pair of angular side walls 258. The clips 236 are designed to be inserted over a corner of the package 230 so that the corner of the package 230 extends into the back portion 256 and further extends through the front portion 254 of the clip 236. The back portion 256 includes a pair of centrally-disposed sloped regions 262 that facilitate the slidable engagement of the package's corner by the back portion 256 of the clip 236. Once the clip 236 is fully engaged on the package 230, a pair of opposed teeth 260 on the front portion 254 prevent the clip 236 from being accidentally removed from the package 230. As shown in FIG. 16, the teeth 260 have a generally ramp-like configuration that facilitates the slidable engagement of the clips 236 onto the corners of the package 230, yet also resists the removal of the clips 236 once attached to the package 230. It should be understood that the invention may be practiced using other forms of supplemental engagement devices instead of the clips 236. For example, adhesive tape could be used to bind the first 232 and second 234 pieces of the package 230 together. The advantage of the clips 236, however, is that they can be repeatedly attached and removed from the package 230 without wearing out or leaving a residue on the package 230.

To use either of the previously described packages 130, 230, an optical pellicle 110 must first be positioned proximate the structure for supporting an optical pellicle on the first piece 132, 232 of the package 130, 230. Next the optical pellicle 110 is placed onto the structure for supporting an optical pellicle so that the pellicle membrane 112 is free from contact with the first piece 132, 232 of the package 130, 230. Finally, the optical pellicle 110 is enclosed in the package 130, 230 by engaging the first piece 132, 232 and the second piece 134, 234 of the package 130, 230 so that the pellicle membrane 112 is free from contact with the first 132, 232 and second 134, 234 pieces of the package 130, 230.

It should be understood that these and other modifications to the preferred embodiments are within the spirit and scope of the present invention and the claims of this disclosure.

It is claimed and desired to secure by Letters Patent:

1. An optical pellicle, comprising:
    a pellicle membrane; and
    a pellicle frame with a bottom cover side, a top membrane side and an outer edge that extends downwardly from the membrane side to the cover side, wherein the pellicle membrane is mounted on and covers a substantial portion of the membrane side of the pellicle frame, and the membrane side includes a peripheral region that extends generally outwardly beyond the pellicle membrane and generally downwardly toward the cover side, the peripheral region including a relieved portion in the form of a chamfer at the periphery of the membrane side of the pellicle frame.

2. An optical pellicle, comprising:
    a pellicle membrane; and
    a pellicle frame with a bottom cover side, a top membrane side and an outer edge that extends downwardly from the membrane side to the cover side, wherein the pellicle membrane is mounted on and covers a substantial portion of the membrane side of the pellicle frame, and the membrane side includes a peripheral region that extends generally outwardly beyond the pellicle membrane and generally downwardly toward the cover side, the peripheral region including an arcuate relieved portion at the periphery of the membrane side of the pellicle frame.

3. The optical pellicle of claim 1, wherein the relieved, chamfered portion includes a first region extending toward the outer edge at a first defined angle and a second region extending from the first region to the outer edge at a second defined angle different than the first defined angle.

4. The optical pellicle of claim 1 or 2, further including a protective cover removably mounted on the cover side of the pellicle frame.

5. The optical pellicle of claim 1 or 2, wherein the pellicle frame has a generally polygonal configuration with plural corner regions, and wherein the peripheral region includes the corner regions of the pellicle frame.

* * * * *